United States Patent
Paavola et al.

(10) Patent No.: US 12,477,691 B2
(45) Date of Patent: Nov. 18, 2025

(54) COOLING SYSTEMS WITH HEAT PIPES FOR ELECTRONIC DEVICES

(71) Applicant: Intel Corporation, Santa Clara, CA (US)

(72) Inventors: Juha Tapani Paavola, Hillsboro, OR (US); Christopher Moore, Warren, OR (US); Jeff Ku, Taipei (TW); Prakash Kurma Raju, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 307 days.

(21) Appl. No.: 18/189,428

(22) Filed: Mar. 24, 2023

(65) Prior Publication Data

US 2024/0324144 A1   Sep. 26, 2024

(51) Int. Cl.
*H05K 7/20*   (2006.01)
*G06F 1/20*   (2006.01)

(52) U.S. Cl.
CPC ......... *H05K 7/20336* (2013.01); *G06F 1/203* (2013.01); *H05K 7/20154* (2013.01)

(58) Field of Classification Search
CPC ............... F28D 15/046; F28D 15/0233; F28D 15/0275; F28D 15/04; F28D 15/0266; F28D 15/0241; H01L 21/4871; H01L 23/3672; F28F 1/022; F28F 1/24; F28F 3/027; H05K 7/20; H05K 7/20336; H05K 7/20809; H05K 7/20154; Y10T 29/49353; B23P 2700/09; B23P 15/26; G06F 1/20; G06F 1/206; G06F 1/203

See application file for complete search history.

(56) References Cited

U.S. PATENT DOCUMENTS

| | | | | |
|---|---|---|---|---|
| 6,056,044 | A * | 5/2000 | Benson | F28D 15/046 165/911 |
| 2001/0047859 | A1* | 12/2001 | Ishida | B21C 37/151 165/104.21 |
| 2003/0159806 | A1* | 8/2003 | Sehmbey | F28D 15/046 257/E23.088 |
| 2004/0069455 | A1* | 4/2004 | Lindemuth | B22F 7/004 29/890.032 |
| 2007/0240860 | A1* | 10/2007 | Meyer | H01L 23/427 29/890.032 |
| 2008/0105405 | A1* | 5/2008 | Hsu | F28D 15/046 165/104.26 |
| 2009/0025910 | A1* | 1/2009 | Hoffman | F28D 15/046 165/104.21 |
| 2009/0084526 | A1* | 4/2009 | Chang | F28D 15/046 165/104.26 |
| 2009/0139696 | A1* | 6/2009 | Shih | F28F 1/022 165/104.26 |
| 2009/0151906 | A1* | 6/2009 | Lai | F28D 15/046 165/104.26 |

(Continued)

*Primary Examiner* — Michael A Matey
(74) *Attorney, Agent, or Firm* — Hanley, Flight & Zimmerman, LLC

(57) ABSTRACT

Cooling systems with heat pipes for electronic devices are disclosed herein. An example cooling system includes a heat pipe having a top wall and a bottom wall. The heat pipe contains a fluid. The cooling system includes a wick disposed in the heat pipe and a stiffener coupled to the wick. The stiffener contacts the top wall and the bottom wall of the heat pipe.

20 Claims, 10 Drawing Sheets

(56) References Cited

U.S. PATENT DOCUMENTS

| | | | | |
|---|---|---|---|---|
| 2009/0260785 | A1* | 10/2009 | Wang | F28D 15/046 165/170 |
| 2010/0006268 | A1* | 1/2010 | Meyer, IV | F28D 15/0233 165/104.19 |
| 2010/0071879 | A1* | 3/2010 | Hou | F28D 15/046 29/890.032 |
| 2011/0174464 | A1* | 7/2011 | Liu | F28D 15/046 29/890.032 |
| 2012/0305223 | A1* | 12/2012 | Yang | F28D 15/046 29/890.032 |
| 2012/0325438 | A1* | 12/2012 | Meyer, IV | F28D 15/046 165/104.26 |
| 2013/0174958 | A1* | 7/2013 | He | B22F 7/002 427/191 |
| 2013/0233518 | A1* | 9/2013 | Liu | F28D 15/04 165/104.26 |
| 2013/0248152 | A1* | 9/2013 | Hwang | F28D 15/0233 165/104.26 |
| 2014/0174700 | A1* | 6/2014 | Lin | F28D 15/046 29/521 |
| 2014/0345832 | A1* | 11/2014 | Lin | F28D 15/046 165/104.26 |
| 2015/0027668 | A1* | 1/2015 | Yang | H05K 7/20336 165/104.21 |
| 2015/0060022 | A1* | 3/2015 | Sun | F28D 15/04 29/890.032 |
| 2015/0200344 | A1* | 7/2015 | Francis | H05K 3/0058 438/28 |
| 2017/0122672 | A1* | 5/2017 | Lin | B23K 35/00 |
| 2018/0128553 | A1* | 5/2018 | Lewis | F28F 3/022 |
| 2018/0320984 | A1* | 11/2018 | Lewis | F28D 15/04 |
| 2020/0025459 | A1* | 1/2020 | Toratani | F28D 15/0233 |
| 2020/0326133 | A1* | 10/2020 | Cheng | H05K 7/20336 |
| 2021/0136956 | A1* | 5/2021 | Paavola | B23P 15/26 |
| 2022/0163268 | A1* | 5/2022 | Lewis | F28D 15/0233 |

\* cited by examiner

COOLING SYSTEMS WITH HEAT PIPES FOR ELECTRONIC DEVICES

FIELD OF THE DISCLOSURE

This disclosure relates generally to electronic devices and, more particularly, to cooling systems with heat pipes for electronic devices.

BACKGROUND

Many electronic devices include a cooling system to help dissipate heat generated by electrical components of the device. For example, some laptop computers or desktop computers include liquid cooling systems or air cooled systems to dissipate heat from the central processing unit (CPU) and other processor circuitry.

BRIEF DESCRIPTION OF THE DRAWINGS

FIG. 2 shows an example processing unit that can be cooled by the example cooling system.

Figure 1:
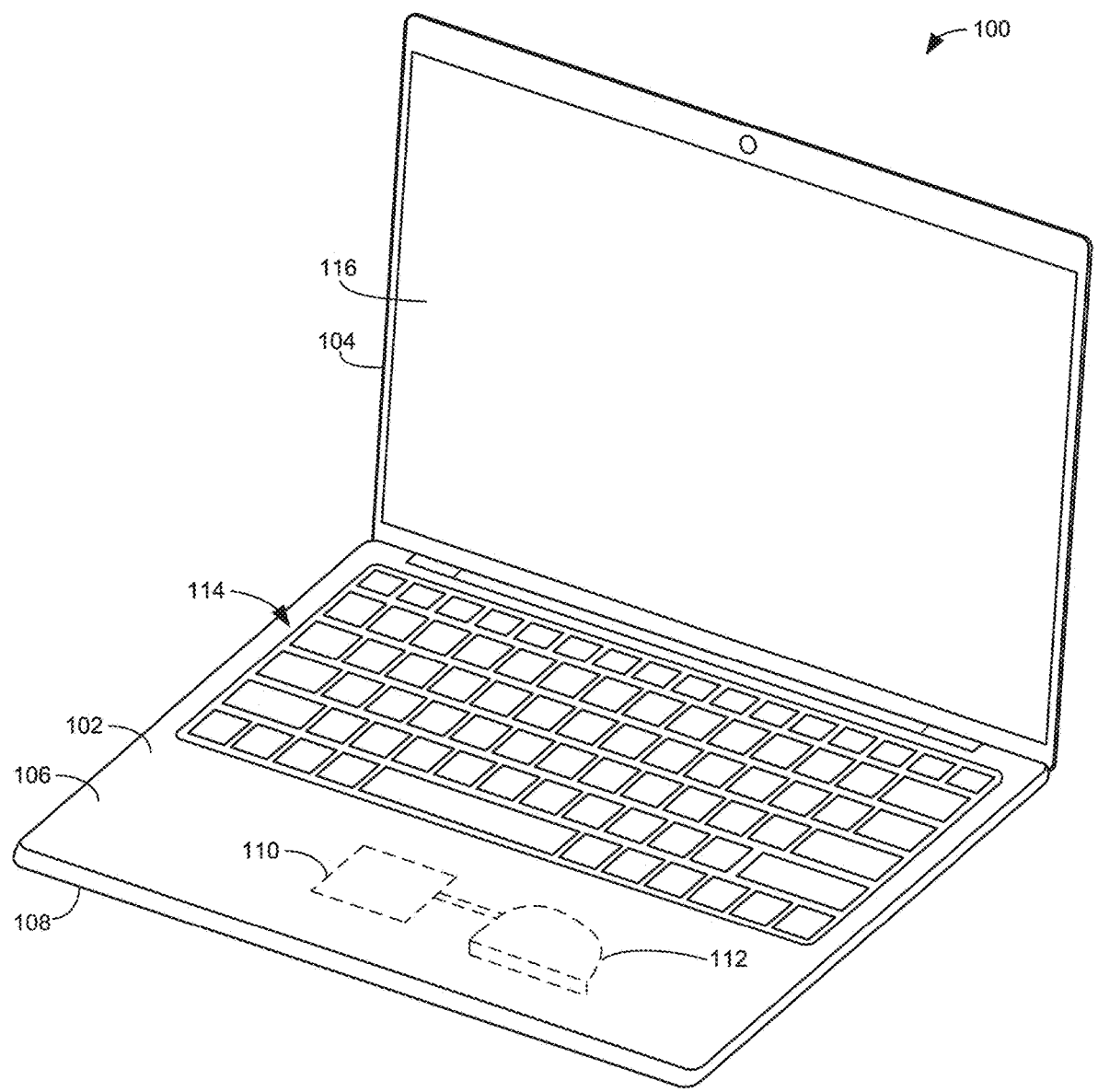
FIG. 1 is a perspective view of an example electronic device in which example cooling systems disclosed herein can be implemented.

In general, the same reference numbers will be used throughout the drawing(s) and accompanying written description to refer to the same or like parts. The figures are not necessarily to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular.

DETAILED DESCRIPTION

Electronic devices, such as computers, laptops, servers, etc. often include electrical components that generate heat. For example, processors, hard drives, batteries, and other electrical components generate heat during operation. Heat can negatively affect the performance of an electrical component as well as other nearby components and, thus, negatively impact the performance of the electronic device.

Therefore, electronic devices often include a cooling system, such as a liquid cooling system. Known cooling systems include a heat pipe that is attached by a cold plate (e.g. a block of copper) to a top of a die or other heat generating electrical component. The heat pipe contains a wick and a fluid, such as water. Heat from the die is transferred through the cold plate to the heat pipe. The fluid in the heat pipe absorbs the heat and is transferred to another end of the heat pipe where a fan blows air across the heat pipe and/or a heat exchanger to cool the fluid.

Manufacturers often desire to reduce the overall height of the cooling system, which enables thinner platforms (e.g., smaller enclosures) and/or room for other devices (e.g., additional memory, antennas, etc.). It is often desired to mount the heat pipe directly on the die, without a cold plate. However, the heat pipe is constructed of a relatively thin-walled material. As such, compressing or loading the heat pipe directly on the die often causes the heat pipe to yield or deflect, which significantly reduces the thermal heat transfer between the die and the heat pipe.

Disclosed herein are example cooling systems with heat pipes that have one or more stiffeners in the heat pipe. In some examples, a stiffener is coupled to the wick that is disposed in the heat pipe. In some examples, the stiffener is implemented as a rivet (e.g., a ballhead rivet). The stiffener contacts or engages the top and bottoms walls of the heat pipe. The stiffener acts as a structural member that transfers or distributes loads between the bottom wall and the top wall. This prevents or reduces bending of the heat pipe. This enables the heat pipe to be disposed on and compressed directly onto the die (or other electronic device) without a cold plate. Some known cold plates are about 0.50-0.80 millimeters (mm) (e.g., +0.10 mm solder layer) in thickness, which is about 50% of the package height and about 10% of the total system thickness. Therefore, removing the cold plate significantly reduces the vertical height or thickness of the system. The use of the stiffener enables the heat pipe to be loaded directly onto the die to ensure proper thermal heat transfer while preventing or reducing bending or deflecting of the heat pipe. In some examples the stiffener is coupled to a wick of fiber material (e.g., woven metal fiber) that is disposed in the heat pipe. In other examples, the stiffener can be used with other types of wicks, such as grooved, sintered, or meshed.

FIG. 1 is a perspective view of an example electronic device 100 in which examples disclosed herein can be implemented. The electronic device 100 is a computing device. In the illustrated example, the electronic device 100 is implemented as laptop computer, referred to herein as the laptop computer 100. However, the examples disclosed herein can be implemented in connection with other types of electronic devices or computing devices, such as personal computers (PCs), servers, tablets, phones, etc.

In the illustrated example, the laptop computer 100 includes a base 102 and a lid 104 that are moveably coupled (e.g., hingedly coupled). The base 102 can also be referred to as a housing or chassis. The base 102 can be constructed of one or more panels or covers. For example, the base 102 has a top cover 106 and a bottom cover 108. The top cover 106 forms a top side of the base 102 and the bottom cover 108 forms a bottom side of the base 102. In some examples the top and bottom covers 106, 108 can be constructed of aluminum, plastic, and/or any other material or combination of materials (e.g., stainless steel). In some examples, the top and bottom covers 106, 108 are separate covers that are coupled together (e.g., via threaded fasteners) and form a housing. In other examples, the top and bottom covers 106, 108 can be constructed as single cover or panel that forms a housing.

In the illustrated example, the base 102 contains (e.g., houses) one or more electrical components 110 of the laptop computer 100. The electrical components 110 may include, for example, processor circuitry (e.g., a central processing unit (CPU), a graphics processing unit (GPU), processor core(s), etc.), one or more storage devices (e.g., solid state memory), one or more batteries, one or more antennas, and/or other hardware and/or circuitry. These electrical components 110 can also be considered heat generating devices. In particular, during operation, the electrical components 110 generate heat. It is generally known that heat tends to degrade the efficiency of electrical components (e.g., computing circuitry). In particular, heat can lower the electrical resistance of objects, therefore increasing the current in those objects.

In the illustrated example, the laptop computer 100 includes a cooling system 112. The cooling system 112 is disposed in the base 102 (e.g., between the top and bottom covers 106, 108). The cooling system 112 is used to cool or dissipate heat generated by the electrical components 110. The example cooling system 112 can be used to reduce the heat and thereby improve performance of the laptop computer 100.

In the illustrated example of FIG. 1, the laptop computer 100 includes an example keyboard 114 carried by the base 102 (e.g., on the top cover 106). In the illustrated example, the laptop computer 100 includes a display 116 carried by the lid 104. The display 116 presents images in response to electrical signals from one or more of the electrical components 110.

Figure 2:
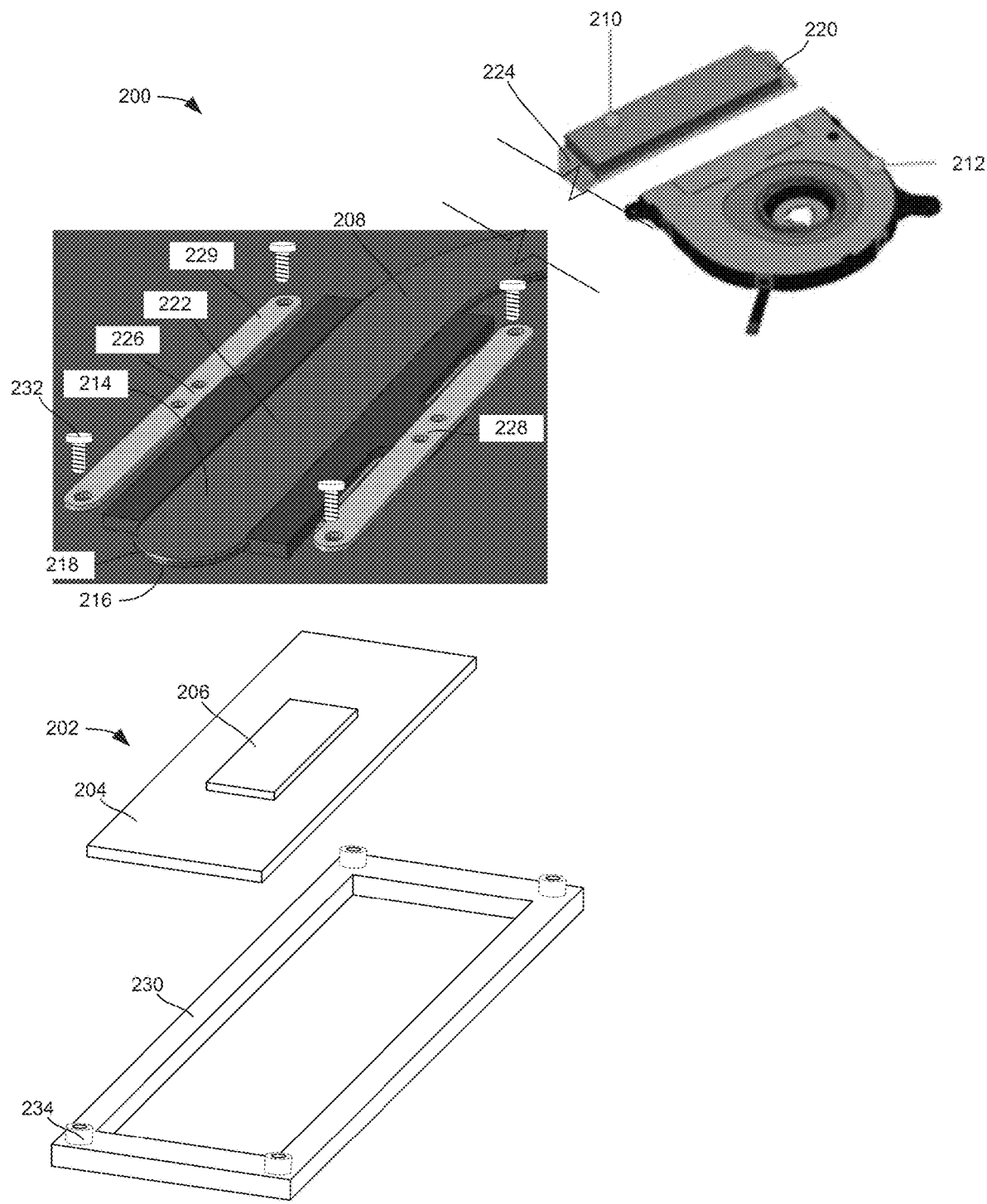
FIG. 2 illustrates an example cooling system with an example heat pipe constructed in accordance with the teachings of this disclosure.

FIG. 2 illustrates an example cooling system 200 constructed in accordance with the teachings of this disclosure. The cooling system 200 can also be referred to as a cooler. The example cooling system 200 can be implemented as the example cooling system 112 of the laptop computer 100 in FIG. 1.

Figure 3:
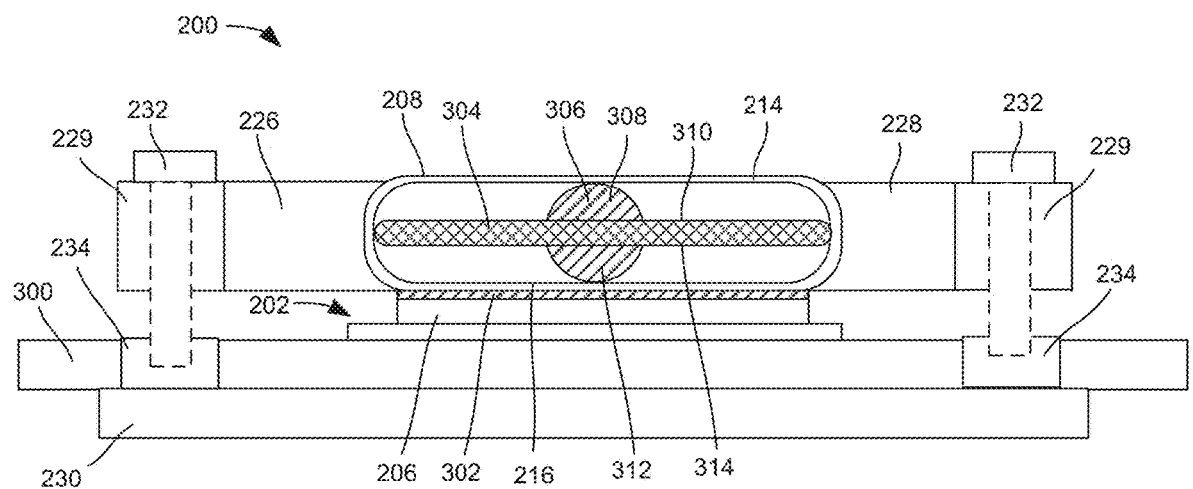
FIG. 3 is a side cross-sectional view showing an example vertical stack-up of the example heat pipe and the example processing unit of FIG. 2.

The example cooling system 200 is shown in connection with an example processing unit 202 of the example laptop computer 100. The example processing unit 202 may be, for example, a central processing unit (CPU), a graphics processing unit (GPU), and/or any other type of electrical processing unit. The processing unit 202 can be coupled to a motherboard or printed circuit board (PCB) (an example of which is shown in FIG. 3). The processing unit 202 includes an example substrate 204 and an example die 206 on the substrate 204 (e.g., a silicone substrate). The die 206 generates heat during operation. While only one die is shown, the processing unit 202 can include any number of dies.

The example cooling system 200 can be used transfer heat away from the die 206 and therefore cool or reduce the temperature of the die 206. This improves computing efficiency of the die 206 and prevents or limits overheating of the die 206. In the illustrated example, the cooling system 200 includes an example heat pipe 208, an example heat exchanger 210 (e.g., a fin bank), and an example fan 212 (sometimes referred to as a blower or variable resistance blower (VRB)). The heat pipe 208 is a thin, flat pipe. The heat pipe 208 is composed or constructed of a thermally conductive material, such as copper. In other examples, the heat pipe 208 can be composed or constructed of other types of materials. The heat pipe 208 can be constructed as a single unitary part or component (e.g., a monolithic structure) or can be constructed or multiple portions or parts that are coupled together.

The heat pipe 208 has a top wall 214 forming a top side or portion of the heat pipe 208 and a bottom wall 216 forming a bottom side or portion of the heat pipe 208. The heat pipe 208 is sealed. In particular, the heat pipe 208 has first and second ends 218, 220 that are closed or crimped. The heat pipe 208 contains an amount of cooling fluid, such as water. In some examples, the heat pipe 208 contains a relatively small amount of water (e.g., two or three drops). In other examples, the heat pipe 208 can include other types of cooling fluids (e.g., glycol) and/or amounts of cooling fluids. The cooling system 200 includes a wick (an example of which is shown in further detail herein) in the heat pipe 208 to help move the cooling fluid through the heat pipe 208. When the cooling system 200 is assembled with the processing unit 202, a first portion 222 of the heat pipe 208 is coupled to and/or disposed on or adjacent the die 206, and a second portion 224 of the heat pipe 208 is disposed adjacent the fan 212. The heat exchanger 210 is coupled to the second portion 224 of the heat pipe 208 in front of the fan 212. The heat pipe 208 can be any length depending on the distance between the die 206 and the fan 212. The heat pipe 208 may include one or more bends in the lateral and/or vertical directions.

In operation, heat from the die 206 is transferred to and/or otherwise absorbed at the first portion 222 of the heat pipe 208 above the die 206. As disclosed above, the heat pipe 208 contains a cooling fluid and a wick. The fluid in the heat pipe 208 is heated and travels (e.g., wicks or moves via capillary action) to the second portion 224 of the heat pipe 208. The heat is transferred to the heat exchanger 210 via conduction. The fan 212 directs air across the heat exchanger 210, thereby dissipating the heat to the surrounding atmosphere. The cooled fluid in the second portion 224 of the heat pipe 208 then travels back to the first portion 222 of the heat pipe 208, and the cycle repeats. Therefore, the heat pipe 208 transfers heat from the die 206 to the heat exchanger 210. In some examples, the cooling fluid in the heat pipe 208 undergoes a phase change (e.g., from liquid to vapor and back to liquid).

In this example, the heat pipe 208 is to be disposed directly on the die 206 (e.g., in direct contact with the die 206), rather than having a cold plate between the heat pipe 208 and the die 206 as seen in known cooling system. This may be referred to as Direct Heat Pipe Attachment (DHA). DHA significantly reduces the vertical height of the package, which is desired in most electronic devices. For example, some known cold plates have a thickness of 0.50-0.80 mm. As such, by removing the cold plate, the entire stack up or vertical height can be reduced at least this amount. This saves valuable space in the base 102 of the laptop computer 100. Therefore, the cooling system 200 in this example does not include a cold plate between the heat pipe 208 and the die 206.

To ensure proper thermal heat transfer, the heat pipe 208 is to be held on the die 206 with a certain load or pressure (e.g., 10 pounds-per-square inch (PSI)) to ensure sufficient contact or closeness between the heat pipe 208 and the die 206. In the illustrated example, the cooling system 200 includes a first mount 226 and a second mount 228 coupled on opposite sides of the heat pipe 208. The first and second mounts 226, 228 may also be referred to as braces or brackets. The first and second mounts 226, 228 have flexible spring arms 229 (e.g., leaf springs) (one of which is referenced in FIG. 2). The spring arms 229 of the first and second mounts 226, 228 are to be coupled to a backing plate 230 that is coupled to the motherboard or PCB. In this example, the first and second mounts 226, 228 are coupled to the backing plate 230 via a plurality of threaded fasteners 232 (e.g., screws, bolts, etc.) (one of which is reference in FIG. 2). The threaded fasteners 232 screw into standoffs 234 (one of which is reference in FIG. 2) on the backing plate 230. In other examples, the first and second mounts 226, 228 can be coupled to the backing plate 230 via other fastening techniques. While in this example the cooling system 200 includes one heat pipe 208, in other examples, the cooling system 200 can include multiple heat pipes. In some examples, the heat pipes run in parallel to each other.

FIG. 3 is a side cross-sectional view of the heat pipe 208 and the processing unit 202. The processing unit 202 is disposed on a top side of a motherboard or PCB 300. The backing plate 230 is disposed on a bottom side the PCB 300. The standoffs 234 extend into the PCB 300. The threaded fasteners 232 extend through the spring arms 229 of the first and second mounts 226, 228 and are screwed into the standoffs 234 of the backing plate 230. As such, the heat pipe 208 is disposed on and loaded onto the die 206. This results in sufficient contact or closeness to ensure thermal transfer from the die 206 to the heat pipe 208. In some examples, a thermal interface material (TIM) 302 is disposed between the die 206 and the bottom wall 216 of the heat pipe 208. In some examples, the TIM 302 is thermal grease. The thermal grease is compressed between the die 206 and the bottom wall 216 of the heat pipe 208. This helps increase the effective contact area (and, thus, heat transfer) between the die 206 and the heat pipe 208. In other examples, the bottom wall 216 of the heat pipe 208 may be in direct contact with the die 206. In some examples, the processing unit 202 may have a lid or integrated heat spreader (IHS) over the die 206. In such an example, the heat pipe 208 may be disposed on and in contact (e.g., direct contact or via TIM) with the lid.

Figure 4:
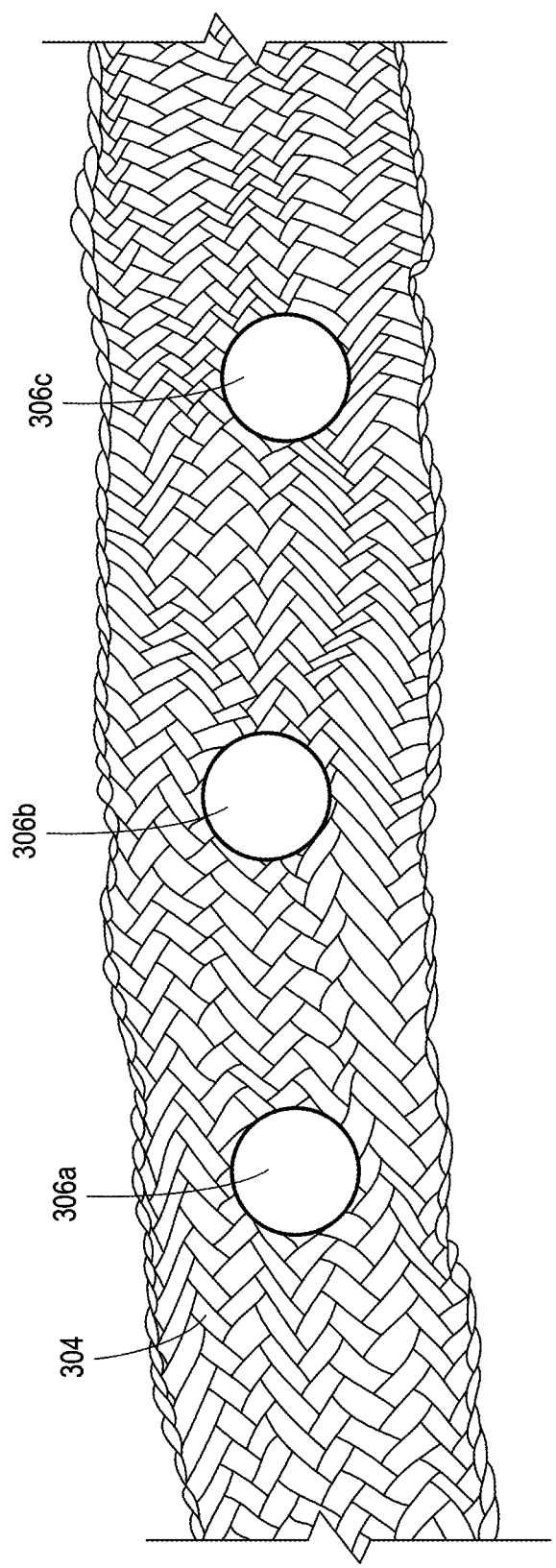
FIG. 4 shows a portion of an example wick and example stiffeners that can be used in the example heat pipe of FIGS. 2 and 3.

As shown in FIG. 3, the cooling system 200 includes a wick 304 disposed in the heat pipe 208. The wick 304 helps move fluid through the heat pipe 208 via capillary action. In some examples, the wick 304 is composed or constructed of a metal, such as copper. FIG. 4 shows a portion of the example wick 304. In this example, the wick 304 is constructed of a fiber material. In particular, in this example, the wick 304 is a woven metal fiber material. In some examples, the metal fiber is constructed of copper or another metal. This woven structure enables the wick 304 to be thermally conductive as well as flexible and able to wick fluid. In other examples, the wick 304 can be composed or constructed of other materials.

Referring back to FIG. 3, the cooling system 200 includes an example stiffener 306 disposed in the heat pipe 208. The stiffener 306 may also be referred to as a support element. In some examples, the stiffener 306 is composed or constructed of a metal, such as copper. In other examples, the stiffener 306 can be composed or constructed of other materials. In this example, the stiffener 306 is coupled to the wick 304. As shown in FIG. 3, the stiffener 306 is engaged or contacting the top and bottom walls 214, 216 of the heat pipe 208. The stiffener 306 acts as a structural member to help distribute pressure and prevent or limit the heat pipe 208 from yield or deflecting. In some examples, the stiffener 306 can be coupled (e.g., welded, fastened) to the top and bottom walls 214, 216 of the heat pipe 208.

Figure 5A:
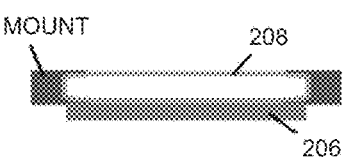
FIG. 5A shows an example of a heat pipe without an example stiffener and no vertical loading.
Figure 5B:
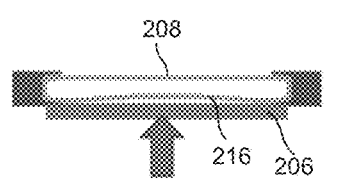
FIG. 5B shows an example of a heat pipe without an example stiffener during vertical loading.
Figure 5C:
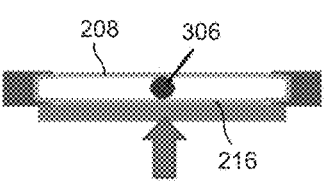
FIG. 5C shows an example of a heat pipe with an example stiffener during vertical loading.

For example, FIG. 5A shows an example of the heat pipe 208 without a stiffener on the die 206 and without vertical loading. FIG. 5B shows the heat pipe 208 of FIG. 5A with static vertical loading. As disclosed above, the heat pipe 208 is loaded or compressed onto the die 206 with a certain pressure to get a certain uniform die pressure. However, the heat pipe 208 is constructed of relatively thin, flimsy material (e.g., thin-walled copper). Therefore, as shown in FIG. 5B, the pressure/load from the die 206 causes the bottom wall 216 of the heat pipe 208 to bend or curve upward. As such, the heat pipe 208 does not have a uniform pressure on the die 206. Instead, the edge pressure is high, but the middle area has very load loading. This reduces the effective cooling capacity for the heat pipe 208. FIG. 5C shows an example of the heat pipe 208 with the stiffener 306 in the heat pipe 208. As shown, the stiffener 306 prevents or reduces bending of the bottom wall 216. As such, a uniform load or pressure can be achieved.

Figure 6A:
FIG. 6A shows an example load path for a heat pipe without an example stiffener.
Figure 6B:
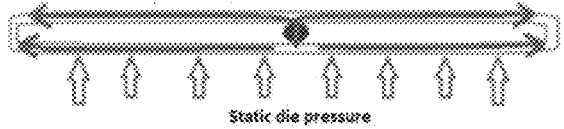
FIG. 6B show an example load path for a heat pipe with an example stiffener.

For example, as shown in FIG. 6A, without the stiffener, the load from the static die pressure is distributed only along the bottom wall 216 of the heat pipe 208. This causes the yielding or deflecting as shown in FIG. 5B. However, as shown in FIG. 6B, with the stiffener 306, the load from the static die pressure is distributed through the stiffener 306 to the top wall 214 of the heat pipe 208. This prevents or significantly reduces the amount of bending or deflecting of the bottom wall 216, and thereby ensures a more uniform pressure and loading between the heat pipe 208 and the die 206 for improved (e.g., optimal) heat transfer.

In the illustrated example of FIGS. 3, 5C, and 6B, the stiffener 306 is spherical-shaped. As shown in FIG. 3, the stiffener 306 is coupled to the wick 304 such that a first portion 308 of the stiffener 306 is on a top side 310 of the wick 304 and engaged with the top wall 214 of the heat pipe 208, and a second portion 312 of the stiffener 306 is on a bottom side 314 of the wick 304 and engaged with the bottom wall 316 of the heat pipe 208. In some examples, it is advantageous to use a stiffener that has a spherical, hemispherical, and/or otherwise rounded or curved shape because if the wick 304 becomes twisted or misaligned in the heat pipe 208, at least a portion of the stiffener 306 will still form a contact point with the walls of the heat pipe 208. For example, during manufacture, the heat pipe 208 starts as a cylindrical pipe. The wick 304 with one or more stiffeners 306 s inserted into the heat pipe 208. Then the heat pipe 208 is flattened into the shape shown in FIGS. 2 and 3. During the flattening process, the wick 304 can be twisted or misaligned in the heat pipe 208. However, even if the stiffener 306 is rotated, the spherical, hemispherical, and/or rounded or curved shape ensures contact between the stiffener 306 and the top and bottom walls 214, 216.

In some examples, the cooling system 200 can include a plurality of stiffeners (e.g., a plurality of additional stiffeners). For example, as shown in FIG. 4, there are three example stiffeners 306a, 306b, 306d coupled to the wick 304. The stiffeners 306a, 306b, 306c are positioned near or along a center of the wick 304. In some examples, the stiffeners 306a, 306b, 306c are coupled to the wick 304 in a line along a longitudinal axis of the wick 304. In some examples, the stiffeners 306a, 306b, 306c are spaced equidistant from one another. In other examples, the stiffeners 306a, 306b, 306c can be spaced differently. Any number of stiffeners can be coupled to the wick 304. When the wick 304 is disposed in the heat pipe 208, the wick 304 controls the positions of the stiffeners 306a, 306b, 306c in the heat pipe 208. As such, the wick 304 is used to locate the stiffeners and keep them in place.

Figure 7:
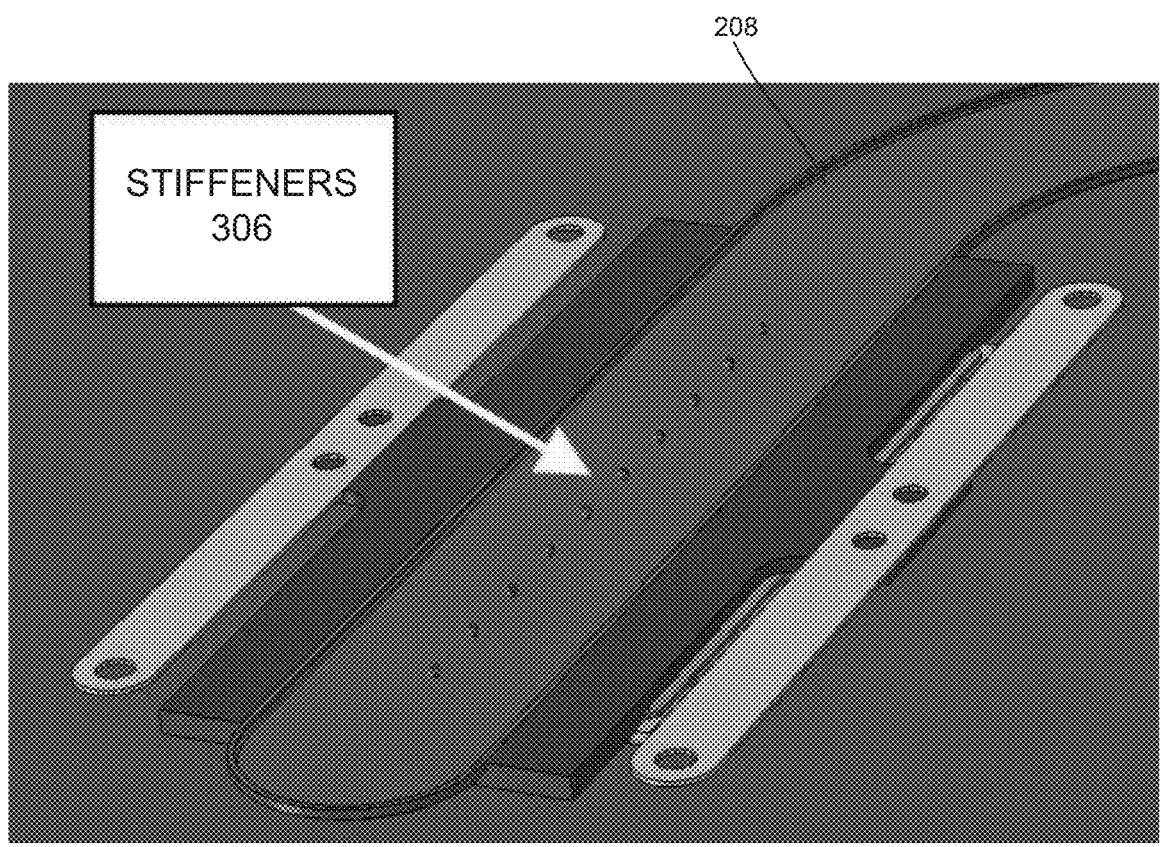
FIG. 7 shows example stiffeners in the example heat pipe of FIG. 2.

FIG. 7 shows the heat pipe 208 with the top wall 214 removed and the wick 304 removed. As shown, the stiffeners 306 are distributed throughout the heat pipe 208 along a center of the heat pipe 208. In some examples, stiffeners are distributed throughout the entire length of the heat pipe 208. In other examples, stiffeners may only be included in the portion of the heat pipe 208 that is coupled to the die 206 (FIG. 2).

Figure 8A:
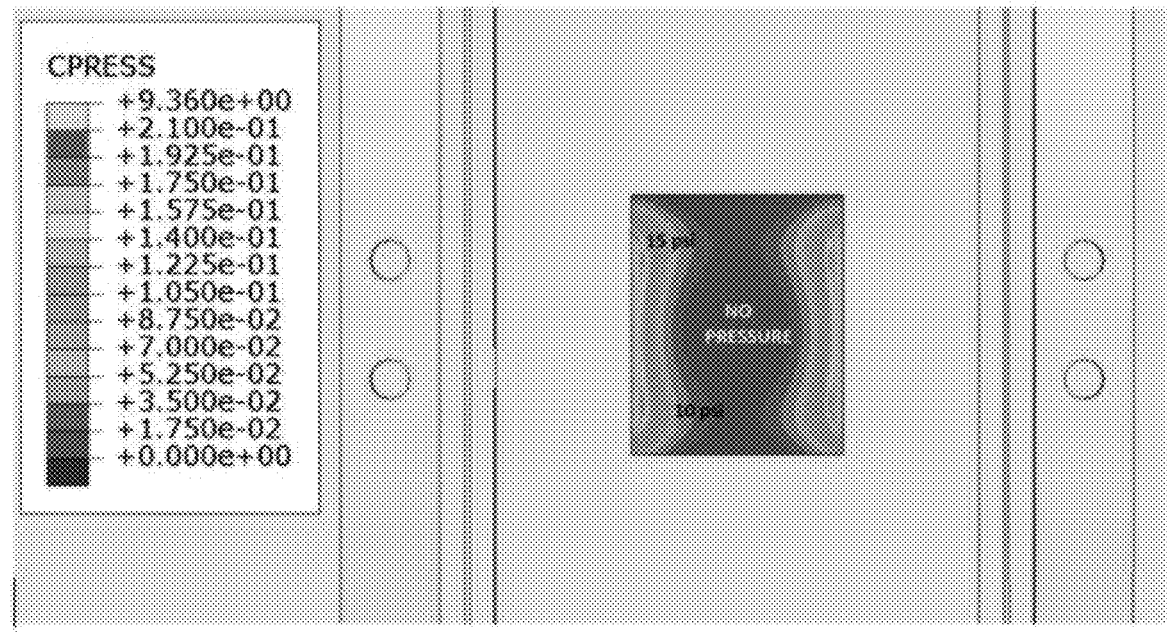
FIG. 8A shows an example map of pressure on a die by a heat pipe without an example stiffener.
Figure 8B:
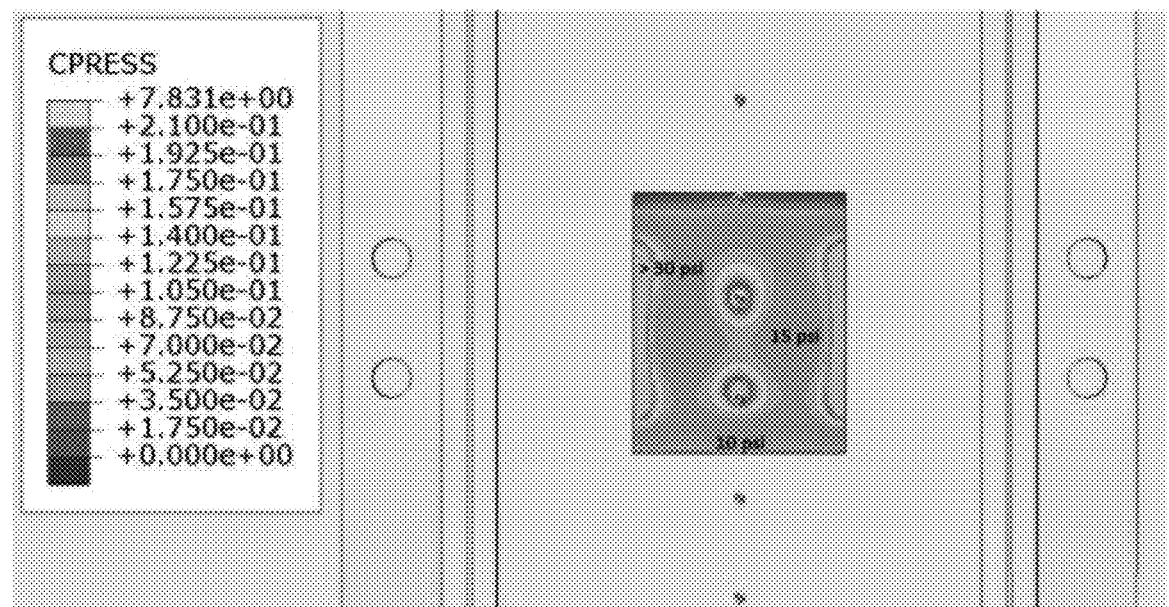
FIG. 8B shows an example map of pressure on a die by a heat pipe with an example stiffener.

FIG. 8A shows an example pressure map of the die 206 when a stiffener is not used. As shown in FIG. 8A, the middle area of the die 206 has zero pressure, while the edges of the die 206 experience relatively high pressure. This results in poor contact for thermal transfer along the middle area of the die 206. FIG. 8B shows an example pressure map of the die 206 with the example stiffeners 306. As shown in FIG. 8B, this increases the middle area pressure from zero to 15 psi. This results in higher levels of contact and loading to ensure proper heat transfer. Also, the edge pressure is divided for a larger area. The maximum stress is significantly under the maximum limit, which may be determined by detailed FE-analysis or testing case-by-case.

Figure 9:
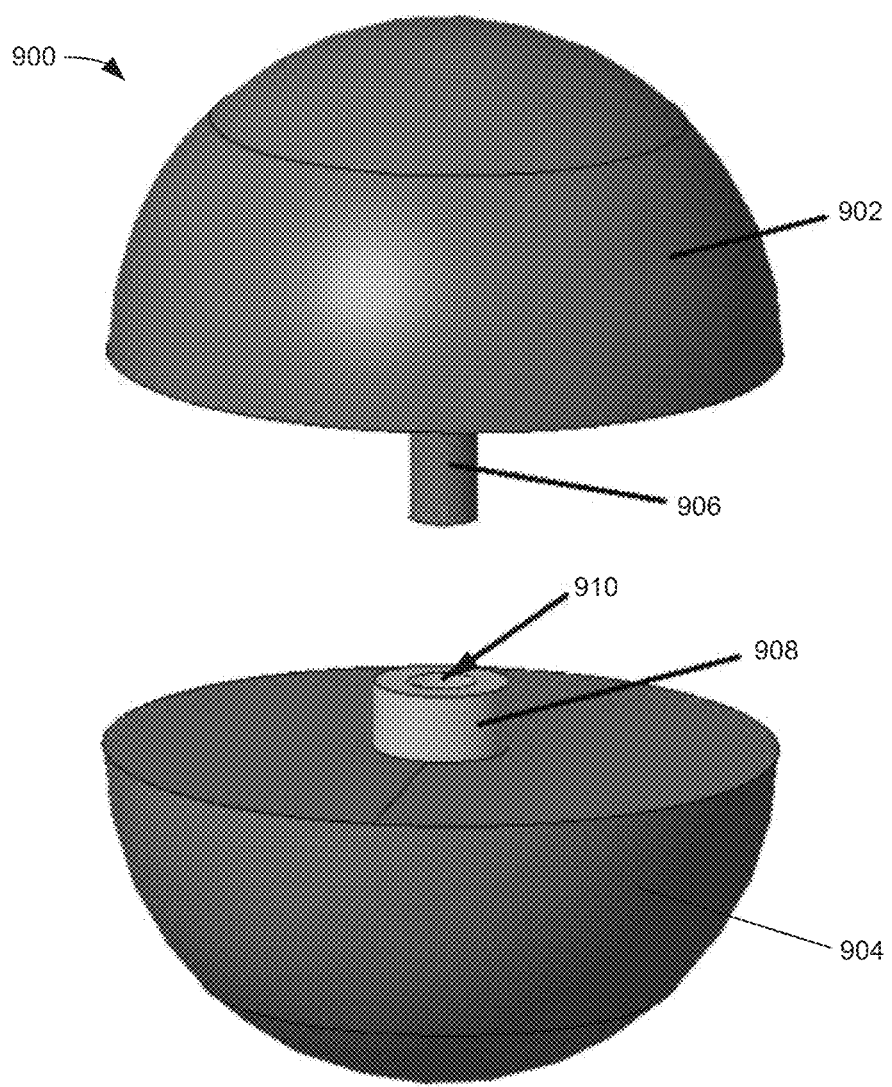
FIG. 9 illustrates an example rivet that can be implemented as an example stiffener.

In some examples, the stiffener 306 is a rivet. For example, FIG. 9 shows an example rivet 900 that can be implemented as one or more of the example stiffeners 306. The rivet 900 can be coupled to the wick 304 and act as the support structure in the heat pipe 208. In this example, the rivet 900 is a double ballhead rivet. The rivet 900 includes a first portion 902 and a second portion 904 that can be coupled together. The first and second portions 902, 904 are rounded or convex. In particular, in this example, the first and second portions 902, 904 are hemispherical-shaped. However, in other examples, the first and second portions 902, 904 can be shaped differently. The first portion 902 has a pin 906 (e.g., a post), and the second portion 904 has a collar 908 (e.g., a stop) with an opening 910. The pin 906 can be inserted into the opening 910 of the collar 908 to couple the first and second portions 902, 904. In some examples, the pin 906 is held in the collar 908 via an interference fit (sometimes referred to as a press fit or friction fit). To couple the rivet 900 to the wick 304, the pin 906 can be inserted through the wick 304, such as by separating some of the fibers or strands for the wick material, and inserted into the collar 908. As such, the first portion 902 would be disposed on the top side 310 of the wick 304 and the second portion 904 would be disposed on the bottom side 314 of the wick 304. This couples the rivet 900 to the wick 304. The collar 908 ensures a gap remains for the wick 304, so the height is the same.

Figure 10:
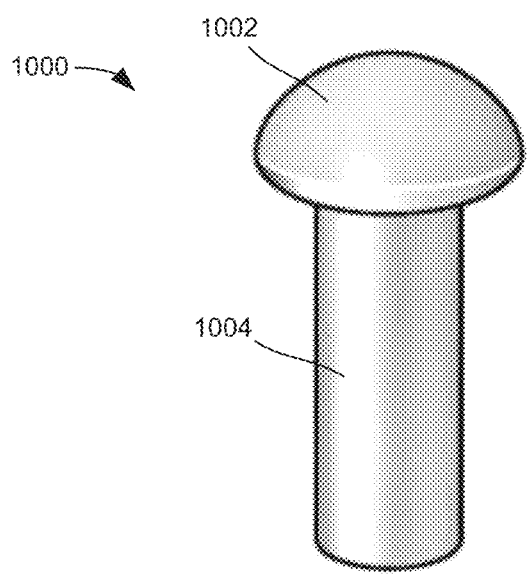
FIG. 10 illustrates another example rivet that can be implemented as the example stiffener.
Figure 11:
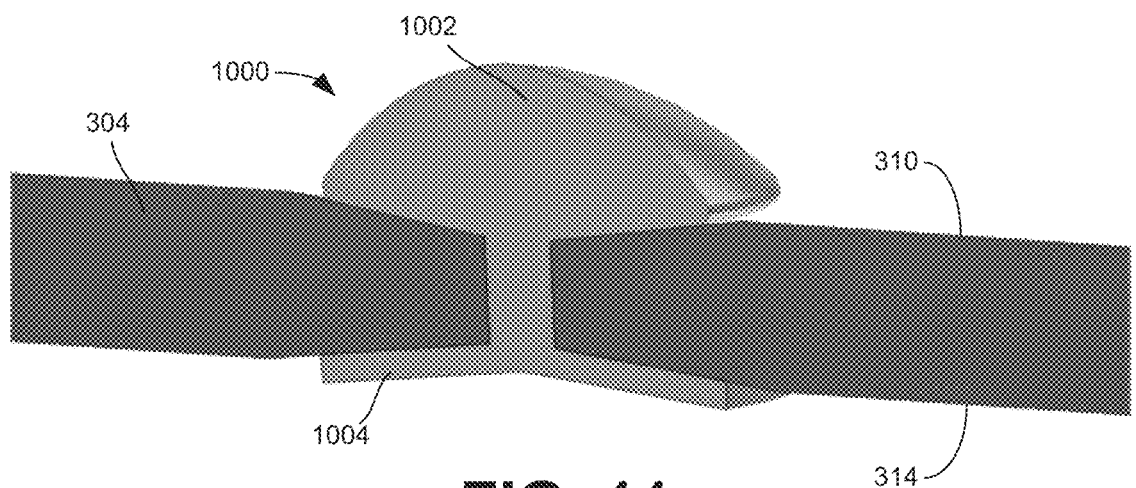
FIG. 11 shows the example rivet of FIG. 10 coupled to the example wick.

FIG. 10 illustrates another example rivet 1000 that can be implemented as the example stiffener 306. In this example, the rivet 1000 is a ballhead rivet. The rivet 1000 has a head 1002 and a pin 1004 (sometimes referred to as a tail). The head 1002 is rounded, convex, or hemispherical-shaped. To couple the rivet 1000 to the wick 304, the pin 1004 can be inserted through the wick 304 and then the pin 1004 is stamped, staked, and/or otherwise deformed (e.g., via a rivet gun). FIG. 11 shows the example rivet 1000 after being coupled to the wick 304. The pin 1004 extends through the wick 304. As shown in FIG. 11, the head 1002 of the rivet 1000 is on the top side 310 of the wick 304 and the flanged side (the deformed pin 1004) is on the bottom side 314 of the wick 304. The flanged side (the deformed pin 1004) of the rivet 1000 has a lower vertical height than the head 1002. This biases the wick 304 closer to the bottom wall 216 of the heat pipe 208. As such, the wick 304 is closer to the heat source, which is more advantageous for absorbing heat.

Figure 12:
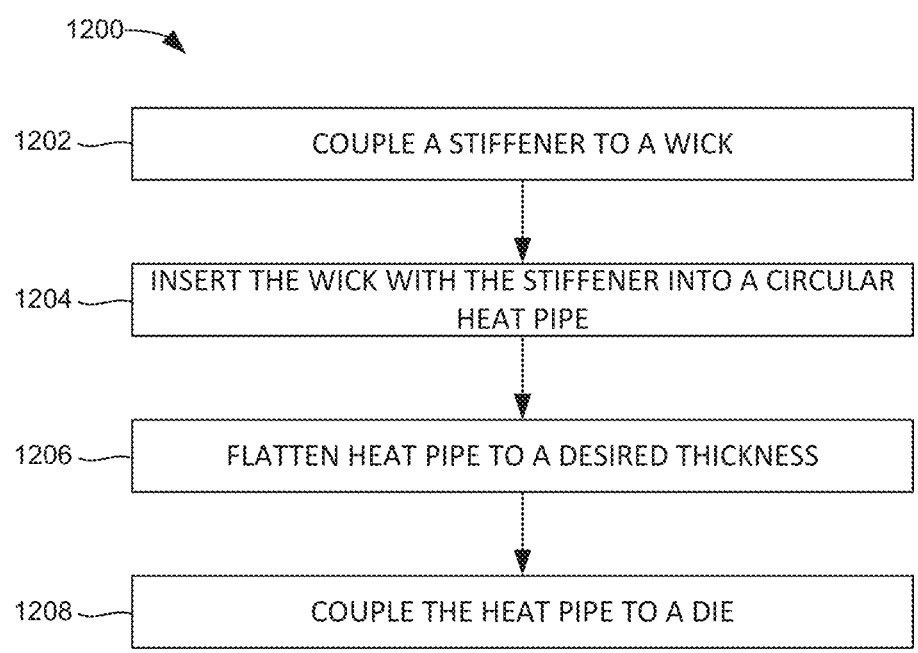
FIG. 12 is a flowchart representative of an example method of constructing an example heat pipe and assembling the example pipe with an example die.

FIG. 12 is a flowchart representative of an example method 1200 of constructing the heat pipe 208 and assembling the heat pipe 208 with the die 206. At block 1202, the method 1200 includes coupling the stiffener 306 to the wick 304. In some examples, multiple stiffeners are coupled to the wick 304, such as shown in FIG. 4. The stiffeners 306 may be implemented as rivets, such as the rivet 900 or the rivet 1000. In some examples, coupling the stiffener 306 to the wick 304 includes inserting the pin 1004 of the rivet 1000 through the wick 304 and deforming the pin 1004. In some examples, the rivet 900, 1000 has a rounded or hemispherical-shaped head, which ensures contact between the stiffener 306 and the walls of the heat pipe 208. In some examples, the stiffener(s) 306 are coupled to the wick 304 prior to insertion in the heat pipe 208.

At block 1204, the method 1200 includes inserting the wick 304 with the stiffener 306 into the heat pipe 208. In some examples, the heat pipe 208 initially has a cylindrical shape. Then, at block 1206, the method 1200 includes flattening the heat pipe 208 until the top wall 214 and the bottom wall 216 of the heat pipe 208 engage the stiffener 306. In some examples, the heat pipe 208 is flattened with a tool or machine. In some examples, before or after the flattening, a fluid (e.g., water) is added to the heat pipe 208 and the ends of the heat pipe 208 are closed, such that the heat pipe 208 is sealed.

At block 1208, the method includes coupling the heat pipe 208 to the die 206. For example, the first and second mounts 226, 228 can be coupled to the backing plate 230 such that the heat pipe 208 is loaded into engagement with the die 206. In some examples, a thermal interface material (e.g., grease) is disposed between the die 206 and the heat pipe 208 to increase heat transfer.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name.

As used herein, "approximately" and "about" modify their subjects/values to recognize the potential presence of variations that occur in real world applications. For example, "approximately" and "about" may modify dimensions that may not be exact due to manufacturing tolerances and/or other real world imperfections as will be understood by persons of ordinary skill in the art. For example, "approximately" and "about" may indicate such dimensions may be within a tolerance range of +/−10% unless otherwise specified in the below description.

As used herein, "processor circuitry" is defined to include (i) one or more special purpose electrical circuits structured to perform specific operation(s) and including one or more semiconductor-based logic devices (e.g., electrical hardware implemented by one or more transistors), and/or (ii) one or more general purpose semiconductor-based electrical circuits programmable with instructions to perform specific operations and including one or more semiconductor-based logic devices (e.g., electrical hardware implemented by one or more transistors). Examples of processor circuitry include programmable microprocessors, Field Programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs). For example, an XPU may be implemented by a heterogeneous computing system including multiple types of processor circuitry (e.g., one or more FPGAs, one or more CPUs, one or more GPUs, one or more DSPs, etc., and/or a combination thereof) and application programming interface(s) (API(s)) that may assign computing task(s) to whichever one(s) of the multiple types of processor circuitry is/are best suited to execute the computing task(s).

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

From the foregoing, it will be appreciated that example methods, systems, apparatus, and articles of manufacture have been disclosed that reduce the thickness of a cooling system for an electronic device. The examples disclosed herein provide structural supports for a heat pipe that enable the heat pipe to be coupled directly (or via TIM) to a die without a cold plate.

Examples and combinations of examples disclosed herein include the following:

Example 1 is a cooling system for an electronic device. The cooling system comprises a heat pipe having a top wall and a bottom wall. The heat pipe contains a fluid. The cooling system also comprises a wick disposed in the heat pipe and a stiffener coupled to the wick. The stiffener contacts the top wall and the bottom wall of the heat pipe.

Example 2 includes the cooling system of Example 1, wherein the stiffener is spherical-shaped.

Example 3 includes the cooling system of Examples 1 or 2, wherein the stiffener is composed of copper.

Example 4 includes the cooling system of any of Examples 1-3, wherein the stiffener is a rivet, and wherein a pin of the rivet extends through the wick.

Example 5 includes the cooling system of Example 4, wherein the stiffener is a ballhead rivet, and wherein a head of the rivet is disposed on one side of the wick and a deformed pin of the rivet is disposed on an opposite side of the wick.

Example 6 includes the cooling system of Example 5, wherein the deformed pin is disposed on a bottom side of the wick.

Example 7 includes the cooling system of Example 4, wherein the stiffener is a double ballhead rivet.

Example 8 includes the cooling system of any of Examples 1-7, further including a plurality of additional stiffeners coupled to the wick.

Example 9 includes the cooling system of Example 8, wherein the plurality of additional stiffeners are coupled to the wick in a line along a longitudinal axis of the wick.

Example 10 includes the cooling system of Examples 8 or 9, wherein the plurality of additional stiffeners are spaced equidistant from one another.

Example 11 includes the cooling system of any of Examples 1-10, further including first and second mounts coupled to opposite sides of the heat pipe, wherein the first and second mounts are to be coupled to a backing plate.

Example 12 is an electronic device comprising a processing unit including a die, and a cooling system including a heat pipe, wherein at least a portion of the heat pipe on the die is to absorb heat from the die; a wick disposed in the heat pipe; and a stiffener coupled to the wick.

Example 13 includes the electronic device of Example 12, wherein the stiffener is a rivet.

Example 14 includes the electronic device of Examples 12 or 13, wherein the stiffener is engaged with top and bottom walls of the heat pipe.

Example 15 includes the electronic device of any of Examples 12-14, wherein the portion of the heat pipe on the die is a first portion, and wherein the cooling system includes: a heat exchanger coupled to a second portion of the heat pipe; and a fan to direct air across the heat exchanger.

Example 16 includes the electronic device of any of Examples 12-15, further including thermal interface material disposed between the die and a bottom wall of the heat pipe.

Example 17 includes the electronic device of any of Examples 12-16, wherein the heat pipe is direct contact with the die.

Example 18 is a method comprising coupling a stiffener to a wick; inserting the wick with the stiffener into a heat pipe of a cooling system for an electronic device, the heat pipe having a cylindrical shape; and flattening the heat pipe until a top wall and a bottom wall of the heat pipe engage the stiffener.

Example 19 includes the method of Example 18, wherein the stiffener is a rivet, and wherein coupling the stiffener to the wick includes inserting a pin of the rivet through the wick and deforming the pin.

Example 20 includes the method of Example 19, wherein the rivet has a rounded or hemispherical-shaped head.

The following claims are hereby incorporated into this Detailed Description by this reference. Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

What is claimed is:

1. A cooling system for an electronic device, the cooling system comprising:
    a heat pipe having a top wall and a bottom wall, the heat pipe containing a fluid;
    a wick in the heat pipe; and
    a stiffener coupled to the wick, the stiffener is spherical-shaped, and the stiffener contacts the top wall and the bottom wall of the heat pipe.

2. The cooling system of claim 1, wherein the stiffener is composed of copper.

3. The cooling system of claim 1, wherein the stiffener includes a rivet, the rivet including a first hemispherical portion, a second hemispherical portion, and a pin extending of the rivet extends through the wick and coupling the first and second hemispherical portions.

4. The cooling system of claim 1, including a plurality of additional stiffeners coupled to the wick.

5. The cooling system of claim 4, wherein the plurality of additional stiffeners are coupled to the wick in a line along a longitudinal axis of the wick.

6. The cooling system of claim 4, wherein the plurality of additional stiffeners are spaced equidistant from one another.

7. The cooling system of claim 1, including first and second mounts coupled to opposite sides of the heat pipe, the first and second mounts are to be coupled to a backing plate.

8. The cooling system of claim 1, wherein a portion of the wick adjacent the stiffener is spaced from the top wall and the bottom wall.

9. A cooling system for an electronic device, the cooling system comprising:
    a heat pipe having a top wall and a bottom wall, the heat pipe containing a fluid;
    a wick in the heat pipe; and
    a stiffener coupled to the wick, the stiffener contacts the top wall and the bottom wall of the heat pipe, the stiffener is a ballhead rivet, and a head of the rivet is on one side of the wick and a deformed pin of the rivet is on an opposite side of the wick.

10. The cooling system of claim 9, wherein the deformed pin is on a bottom side of the wick.

11. The cooling system of claim 9, wherein a portion of the wick adjacent the stiffener is spaced from the top wall and the bottom wall.

12. The cooling system of claim 9, wherein the stiffener is one of a plurality of stiffeners coupled to the wick along a longitudinal axis of the wick.

13. A cooling system for an electronic device, the cooling system comprising:
    a heat pipe having a top wall and a bottom wall, the heat pipe containing a fluid;
    a wick in the heat pipe; and
    a stiffener coupled to the wick, the stiffener contacts the top wall and the bottom wall of the heat pipe, and the stiffener is a double ballhead rivet.

14. The cooling system of claim 13, wherein a portion of the wick adjacent the stiffener is spaced from the top wall and the bottom wall.

15. The cooling system of claim 13, wherein the stiffener is one of a plurality of stiffeners disposed along a longitudinal axis of the wick.

16. The cooling system of claim 13, wherein the stiffener includes copper.

17. An electronic device comprising:
    a processing unit including a die; and
    the cooling system of claim 1,
        at least a portion of the heat pipe on the die is to absorb heat from the die.

18. The electronic device of claim 17, wherein the portion of the heat pipe on the die is a first portion, and the cooling system includes:
    a heat exchanger coupled to a second portion of the heat pipe; and
    a fan to direct air across the heat exchanger.

19. The electronic device of claim 17, including thermal interface material between the die and the bottom wall of the heat pipe.

20. The electronic device of claim 17, wherein the heat pipe is in direct contact with the die.

* * * * *